United States Patent
Sandri et al.

(10) Patent No.: US 8,971,137 B2
(45) Date of Patent: Mar. 3, 2015

(54) BIT BASED FUSE REPAIR

(71) Applicant: Intel Corporation, Santa Clara, CA (US)

(72) Inventors: Jason G. Sandri, Gilbert, AZ (US); Ian S. Walker, Pennsburg, PA (US); Monib Ahmed, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 28 days.

(21) Appl. No.: 13/788,020

(22) Filed: Mar. 7, 2013

(65) Prior Publication Data

US 2014/0254296 A1 Sep. 11, 2014

(51) Int. Cl.
| | | |
|---|---|---|
| *G11C 17/16* | (2006.01) | |
| *G11C 29/04* | (2006.01) | |
| *G11C 11/418* | (2006.01) | |
| *G11C 17/18* | (2006.01) | |
| G11C 29/02 | (2006.01) | |
| G11C 29/00 | (2006.01) | |
| G11C 29/44 | (2006.01) | |

(52) U.S. Cl.
CPC ............... *G11C 29/04* (2013.01); *G11C 17/18* (2013.01); *G11C 29/02* (2013.01); *G11C 29/787* (2013.01); *G11C 11/418* (2013.01); *G11C 17/16* (2013.01); *G11C 2029/4402* (2013.01)

USPC .............. 365/200; 365/225.7; 365/230.01

(58) Field of Classification Search
CPC ............ G11C 17/16; G11C 17/18; G11C 2029/4402; G11C 29/787; G11C 29/02; G11C 29/04; G11C 11/418
USPC .................... 365/200, 255.7, 230.01
See application file for complete search history.

(56) References Cited

U.S. PATENT DOCUMENTS

| | | | | |
|---|---|---|---|---|
| 7,162,668 | B2 * | 1/2007 | Roohparvar ................... | 714/710 |
| 2002/0001246 | A1 * | 1/2002 | Hidaka ........................... | 365/222 |
| 2003/0053348 | A1 * | 3/2003 | Marotta ......................... | 365/200 |
| 2003/0110349 | A1 * | 6/2003 | Zimmerman et al. ........ | 711/105 |
| 2004/0129952 | A1 * | 7/2004 | Griesmer et al. ............. | 257/202 |
| 2004/0205428 | A1 * | 10/2004 | Nanba et al. .................. | 714/718 |
| 2007/0133324 | A1 * | 6/2007 | Nakaya et al. ................ | 365/200 |
| 2011/0235388 | A1 * | 9/2011 | Nakano et al. ................ | 365/96 |
| 2013/0128679 | A1 * | 5/2013 | Kurjanowicz et al. ........ | 365/200 |

FOREIGN PATENT DOCUMENTS

JP          03137898 A    *  6/1991

* cited by examiner

*Primary Examiner* — Ly D Pham
(74) *Attorney, Agent, or Firm* — Trop, Pruner & Hu, P.C.

(57) ABSTRACT

In accordance with some embodiments, instead of providing replacement rows, an area within a fuse array may be reserved for storing addresses of bits that are defective. Then these bits can be readily repaired by simply reading the stored state of identified defective bit, and inverting the stored state of the identified defective bit to get the correct output.

21 Claims, 4 Drawing Sheets

BIT BASED FUSE REPAIR

BACKGROUND

This relates generally to fuse arrays.

Fuse arrays are widely used to store information about the level of services that have been acquired by a user. For example, in a set top box or cable box, a fuse may be set to indicate services that the user has paid for. However, a wide variety of other uses are also possible.

One problem that arises is that when a fuse bit is defective, the entire fuse array would have to be discarded. One approach to avoiding this problem is to provide redundant fuses. These redundant fuses are then addressed in place of regular fuses that are defective. Generally, this requires replacing an entire row of fuses just because one bit in that row is defective.

BRIEF DESCRIPTION OF THE DRAWINGS

Some embodiments are described with respect to the following figures.

DETAILED DESCRIPTION

In accordance with some embodiments, instead of providing replacement rows, an area within a fuse array may be reserved for storing addresses of bits that are defective. Then these bits can be readily repaired by simply reading the stored state of identified defective bit, and inverting the stored state of the identified defective bit to get the correct output.

In some cases, this storing of defective fuse addresses may be more efficient than devoting an entire redundant row for one bad bit. Instead, in a conventional 32 bit row, four different repair options may be afforded for the repair of up to four different bits by merely storing addresses of defective bits.

Figure 1:
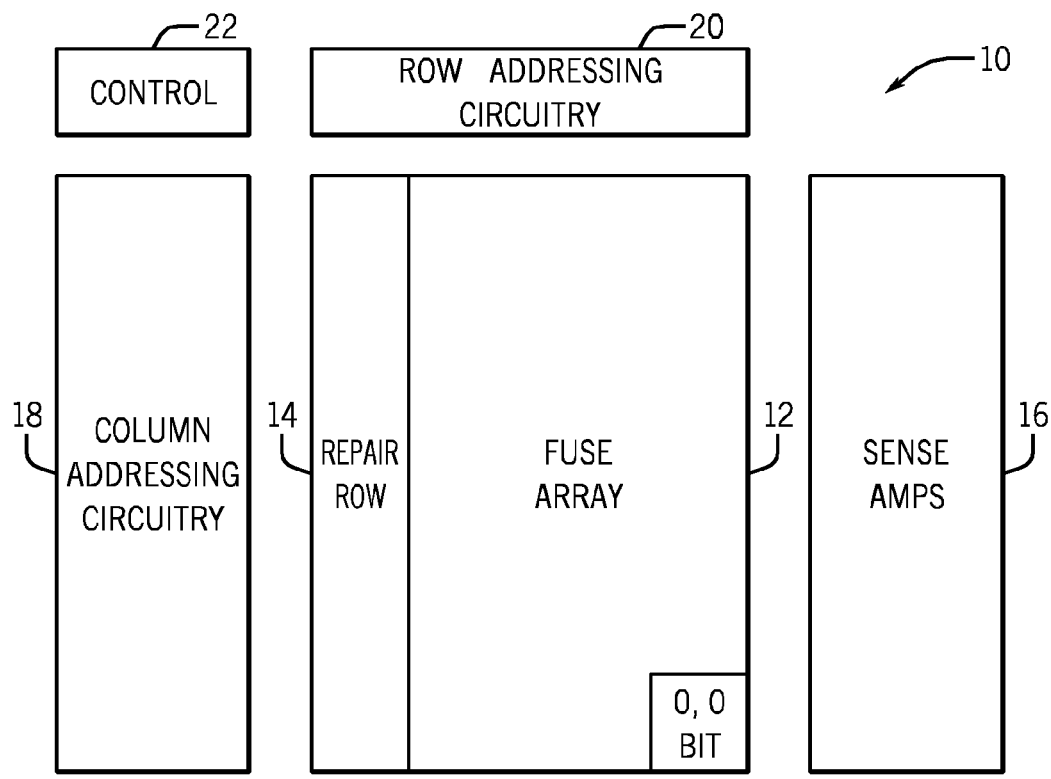
FIG. 1 a schematic depiction of one embodiment of the present invention.

Referring to FIG. 1, a fuse array integrated circuit 10 may be implemented in any non-volatile memory, including conventional fuses, one-time programmable memory, or on-die programmable fuses, to mention some examples. The fuse array 12 may be addressed by row addressing circuitry 20 and column addressing circuitry 18 in some embodiments. Sense amplifiers 16 sense the state of the stored data. A control 22 may be responsible for controlling the circuitry 18 and 20 and the sense amplifier 16. In some embodiments, a repair row 14 may be provided along one edge of the fuse array for storing addresses of defective bits. In addition, a conventional bit may be located within the array in the lower right hand corner, in one embodiment at address row 0, column 0 (0,0). Of course, more than one row or one or more columns may also be used for storing defective bit addresses.

Figure 2:
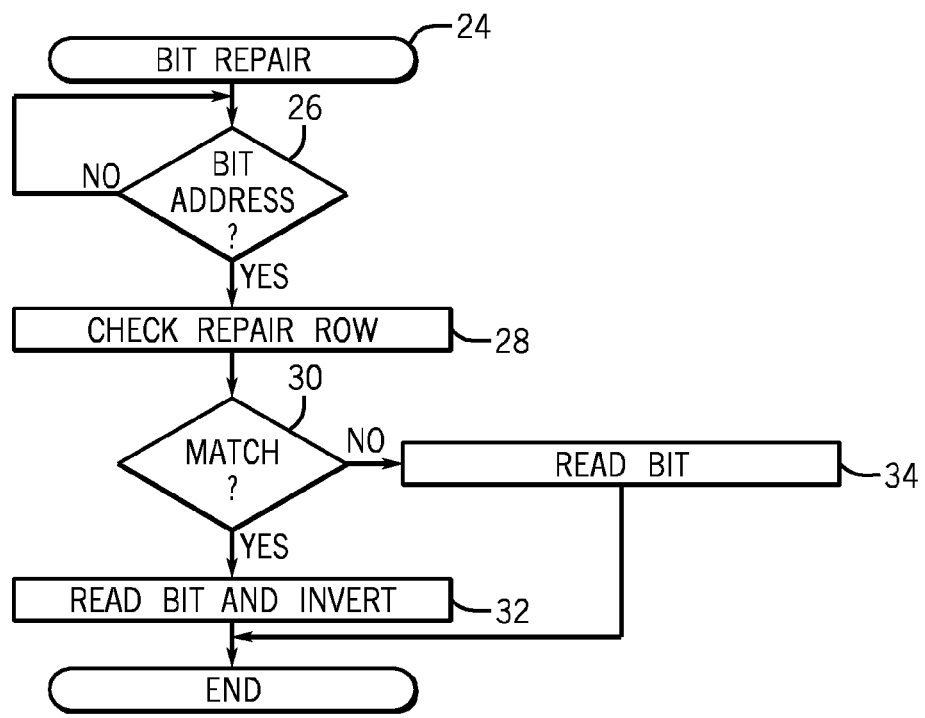
FIG. 2 is a flow chart for a sequence for bit based repair.

In order to repair a set of bits using the repair row 14, a sequence 24, shown in FIG. 2, may be utilized in some embodiments. It may be implemented in software, firmware, and/or hardware. In software and firmware embodiments, it may be implemented by computer executed instructions stored in one or more non-transitory computer readable media, such as a magnetic, optical, or semiconductor storage. In one embodiment, the sequence 24 may be implemented within the control 22 (FIG. 1).

The bit repair sequence 24 begins by determining whether a bit address for a read access has been received, as determined in diamond 26. If so, that address can be searched for within the repair row, as indicated in block 28. If the address is stored in the repair row, then a match may be detected at diamond 30. In such case, the bit at the defective location is read and inverted, as indicated in block 32. Otherwise, the bit is good and it can be read, as indicated in block 34.

As one example, a fuse array may be made up of 32 rows, each with 32 bits. Ten bits are then required to uniquely address any fuse bit in a one thousand bit fuse array. However, as the repair row itself is also susceptible to fuse failures, 33 rows are ideally addressable, leading to a need for 11 bits total to address a defective bit.

To reduce the high failure fallout due to defective fuses, the $33^{rd}$ row may be architecturally designed to be the fuse repair row instead of being a redundant fuse row. Using the entire row for fuse repair, up to four bits can be repaired in a one thousand bit fuse block. The repair mechanism does not repair the actual fuse. It is merely an indicator that the bit is not at the correct value and needs to be inverted. During fuse sensing or fuse reading, logic then uses this repair information to invert the fuse value that was read before sending the fuse data to the rest of the integrated circuit.

Thus, with a single repair row, four different modalities may be undertaken in one embodiment. In repair zero, the first nine bits of the row may be used to provide the row address and the column address of defective bits. Any fuse in the data portion of the fuse block can be repaired except row 0, column 0. Similarly, repair one may be implemented by bits from bits 10 to 19. This provides room for a row address and a column address. Again, any fuse in the data portion can be repaired, except row 0, column 0. Next, repair two uses bits 20-30 and includes a row address and a column address. This can repair any fuse in the data portion and any portion of the repair row. Again, it cannot repair row 0, column 0. Finally, repair three includes one bit and it can only be used to repair the fuse at row 0, column 0.

Thus, any three random bits can be fixed, while also providing a unique indicator for row 0, column 0. The row 0, column 0 dedicated repair bit removes the corner case where the repair rows are all zero, for example, because initially the chip is set with all bits at zero. Otherwise, this situation would have all three repair addresses pointing to the same row 0, column 0 address.

As a simple example, if row 7, column 6 fuse is corrupted, the value of 10'b00_1100_0111 can be written to repair zero and a multiplexer may select the inverted value of the fuse. Similarly, if row 0, column 0 is corrupted, then the value of 1'b1 can be written into repair three and a multiplexer may select the inverted value of the fuse.

Figure 3:
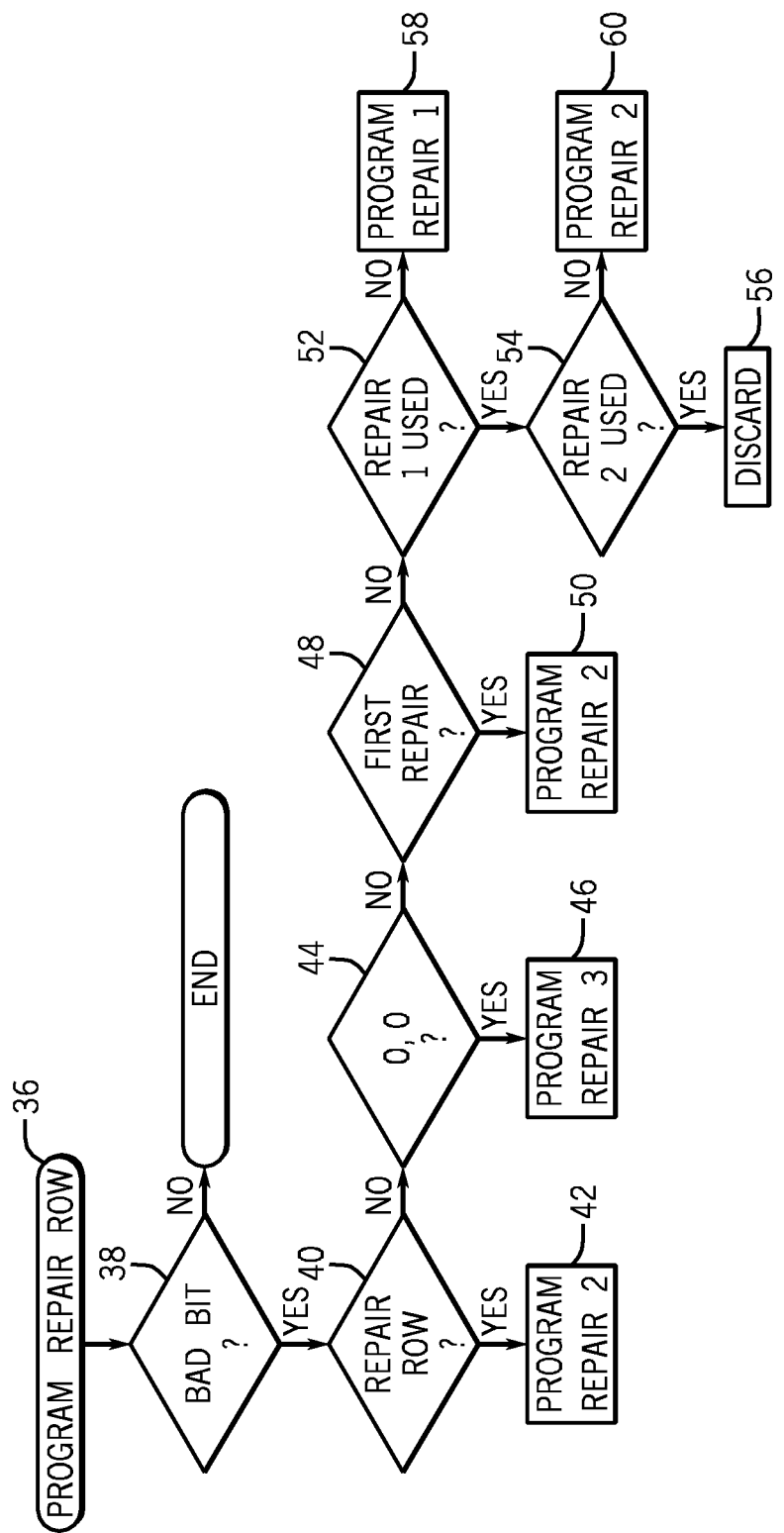
FIG. 3 is a flow chart for a sequence for programming bit based repair according to one embodiment.

In order to program the repair row, the sequence shown in FIG. 3 may be used in some embodiments. It may be implemented in hardware, software, and/or firmware. In software and firmware embodiments, it may be implemented by computer executed instructions stored in one or more non-transitory computer readable media, such as a magnetic, optical, or semiconductor storage. For example, it may be stored within the control 22 (FIG. 1).

The sequence 36 begins by determining if there is a defective bit, as indicated in block 38. This will become known through normal chip testing. If there are no bits that are bad, then the flow ends. Otherwise, a check at diamond 40 determines whether the bad bit is in the repair row. If so, repair two is programmed, as indicated in block 42. Otherwise, a check at diamond 44 determines whether the bit at 0,0 (using an x, y bit coordinate system) is the defective bit. If so, repair three is programmed, as indicated in block 46.

If neither the 0,0 bit or the repair row are implicated, a check at diamond 48 determines whether this is the first repair of a non-repair row, non-0,0 bit. If so, the bad bit is programmed into repair two, as indicated in block 50. Otherwise, a check at diamond 52 determines whether repair one has already been used. If not, repair one may be programmed, as indicated in block 58.

If repair one has already been used, as determined in diamond 52, a check at diamond 54 determines whether repair two has already been used. If not, then repair two may be programmed, as indicated in block 60. Otherwise, the chip cannot be repair and it may be discarded in block 56.

According to one embodiment, the following scheme may be used in some embodiments.

|  | Row [32] Bits | | |
|---|---|---|---|
| Repair 3 | 31 | 31 | Can repair only the fuse at Row [0]. Col. [0]. |
| Repair 2 | 30:20 | 30:25 Row address | Can repair any fuse in the data portion (Rows [31:0]) and repair row (Row [32]) of the fuse block, except Row [0]. Col. [0]. |
|  |  | 24:30 Column address |  |
| Repair 1 | 19:10 | 19:15 Row address | Can repair any fuse in the data portion (Rows [31:0]) of the fuse block, except Row [0]. Col. [0]. |
|  |  | 14:10 Column address |  |
| Repair 0 | 9:0 | 9:5 Row address | Can repair any fuse in the data portion (Rows [31:0]) of the fuse block, except Row [0]. Col. [0]. |
|  |  | 4:0 Column address |  |

Figure 4:
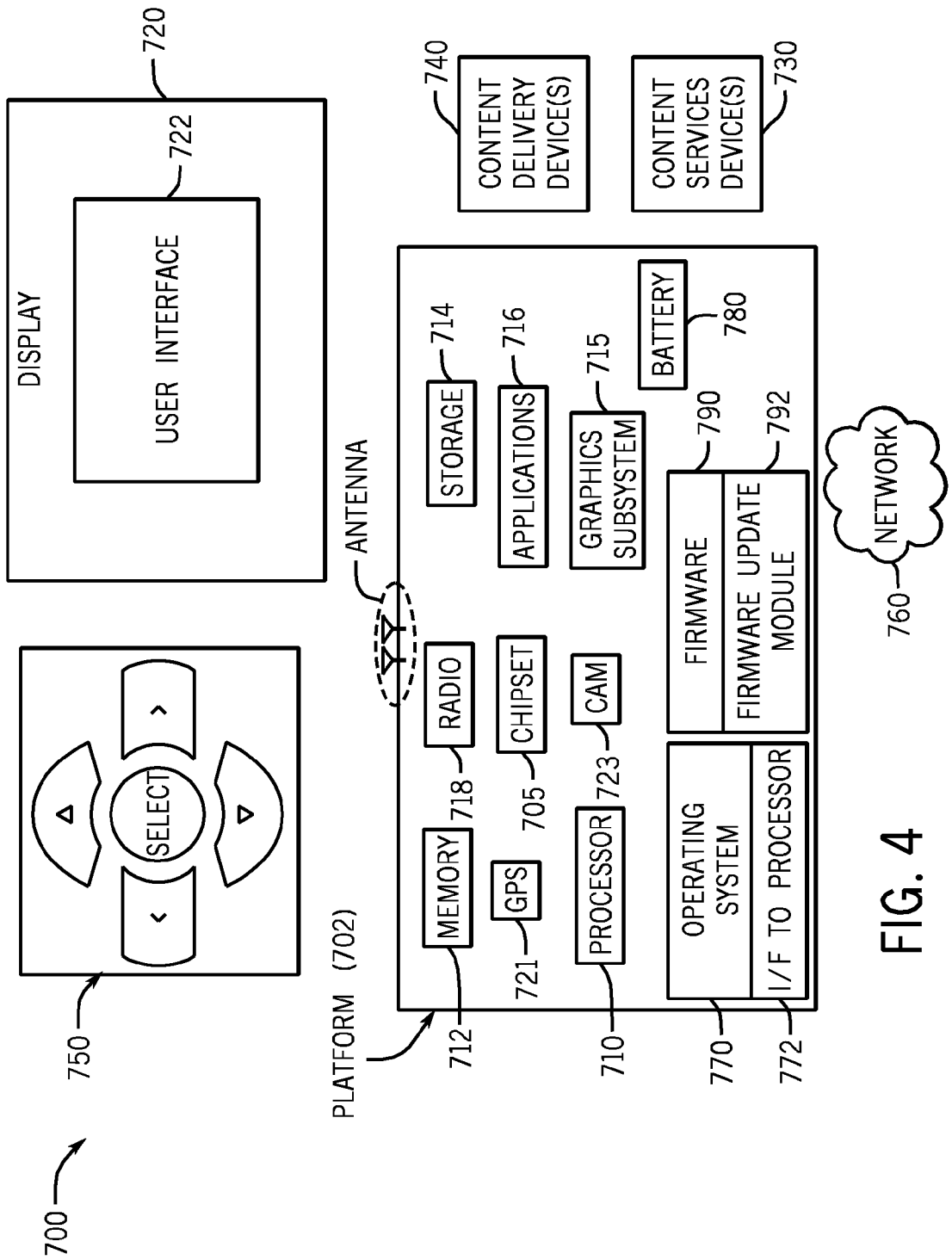
FIG. 4 is a system depiction for one embodiment.

FIG. 4 illustrates an embodiment of a system 700. In embodiments, system 700 may be a media system although system 700 is not limited to this context. For example, system 700 may be incorporated into a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

In embodiments, system 700 comprises a platform 702 coupled to a display 720. Platform 702 may receive content from a content device such as content services device(s) 730 or content delivery device(s) 740 or other similar content sources. A navigation controller 750 comprising one or more navigation features may be used to interact with, for example, platform 702 and/or display 720. Each of these components is described in more detail below.

In embodiments, platform 702 may comprise any combination of a chipset 705, processor 710, memory 712, storage 714, graphics subsystem 715, applications 716 and/or radio 718. Chipset 705 may provide intercommunication among processor 710, memory 712, storage 714, graphics subsystem 715, applications 716 and/or radio 718. For example, chipset 705 may include a storage adapter (not depicted) capable of providing intercommunication with storage 714.

Processor 710 may be implemented as Complex Instruction Set Computer (CISC) or Reduced Instruction Set Computer (RISC) processors, x86 instruction set compatible processors, multi-core, or any other microprocessor or central processing unit (CPU). In embodiments, processor 710 may comprise dual-core processor(s), dual-core mobile processor(s), and so forth. The processor may implement the sequences of FIGS. 2 and 3, together with memory 712.

Memory 712 may be implemented as a volatile memory device such as, but not limited to, a Random Access Memory (RAM), Dynamic Random Access Memory (DRAM), or Static RAM (SRAM).

Storage 714 may be implemented as a non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In embodiments, storage 714 may comprise technology to increase the storage performance enhanced protection for valuable digital media when multiple hard drives are included, for example.

Graphics subsystem 715 may perform processing of images such as still or video for display. Graphics subsystem 715 may be a graphics processing unit (GPU) or a visual processing unit (VPU), for example. An analog or digital interface may be used to communicatively couple graphics subsystem 715 and display 720. For example, the interface may be any of a High-Definition Multimedia Interface, DisplayPort, wireless HDMI, and/or wireless HD compliant techniques. Graphics subsystem 715 could be integrated into processor 710 or chipset 705. Graphics subsystem 715 could be a stand-alone card communicatively coupled to chipset 705.

The graphics and/or video processing techniques described herein may be implemented in various hardware architectures. For example, graphics and/or video functionality may be integrated within a chipset. Alternatively, a discrete graphics and/or video processor may be used. As still another embodiment, the graphics and/or video functions may be implemented by a general purpose processor, including a multi-core processor. In a further embodiment, the functions may be implemented in a consumer electronics device.

Radio 718 may include one or more radios capable of transmitting and receiving signals using various suitable wireless communications techniques. Such techniques may involve communications across one or more wireless networks. Exemplary wireless networks include (but are not limited to) wireless local area networks (WLANs), wireless personal area networks (WPANs), wireless metropolitan area network (WMANs), cellular networks, and satellite networks. In communicating across such networks, radio 718 may operate in accordance with one or more applicable standards in any version.

In embodiments, display 720 may comprise any television type monitor or display. Display 720 may comprise, for example, a computer display screen, touch screen display, video monitor, television-like device, and/or a television. Display 720 may be digital and/or analog. In embodiments, display 720 may be a holographic display. Also, display 720 may be a transparent surface that may receive a visual projection. Such projections may convey various forms of information, images, and/or objects. For example, such projections may be a visual overlay for a mobile augmented reality (MAR) application. Under the control of one or more software applications 716, platform 702 may display user interface 722 on display 720.

In embodiments, content services device(s) 730 may be hosted by any national, international and/or independent service and thus accessible to platform 702 via the Internet, for example. Content services device(s) 730 may be coupled to platform 702 and/or to display 720. Platform 702 and/or content services device(s) 730 may be coupled to a network 760 to communicate (e.g., send and/or receive) media information to and from network 760. Content delivery device(s) 740 also may be coupled to platform 702 and/or to display 720.

In embodiments, content services device(s) 730 may comprise a cable television box, personal computer, network, telephone, Internet enabled devices or appliance capable of delivering digital information and/or content, and any other similar device capable of unidirectionally or bidirectionally communicating content between content providers and platform 702 and/display 720, via network 760 or directly. It will be appreciated that the content may be communicated unidirectionally and/or bidirectionally to and from any one of the components in system 700 and a content provider via network 760. Examples of content may include any media information including, for example, video, music, medical and gaming information, and so forth.

Content services device(s) 730 receives content such as cable television programming including media information, digital information, and/or other content. Examples of content providers may include any cable or satellite television or radio or Internet content providers. The provided examples are not meant to limit embodiments of the invention.

In embodiments, platform 702 may receive control signals from navigation controller 750 having one or more navigation features. The navigation features of controller 750 may be used to interact with user interface 722, for example. In embodiments, navigation controller 750 may be a pointing device that may be a computer hardware component (specifically human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of controller 750 may be echoed on a display (e.g., display 720) by movements of a pointer, cursor, focus ring, or other visual indicators displayed on the display. For example, under the control of software applications 716, the navigation features located on navigation controller 750 may be mapped to virtual navigation features displayed on user interface 722, for example. In embodiments, controller 750 may not be a separate component but integrated into platform 702 and/or display 720. Embodiments, however, are not limited to the elements or in the context shown or described herein.

In embodiments, drivers (not shown) may comprise technology to enable users to instantly turn on and off platform 702 like a television with the touch of a button after initial boot-up, when enabled, for example. Program logic may allow platform 702 to stream content to media adaptors or other content services device(s) 730 or content delivery device(s) 740 when the platform is turned "off." In addition, chip set 705 may comprise hardware and/or software support for 5.1 surround sound audio and/or high definition 7.1 surround sound audio, for example. Drivers may include a graphics driver for integrated graphics platforms. In embodiments, the graphics driver may comprise a peripheral component interconnect (PCI) Express graphics card.

In various embodiments, any one or more of the components shown in system 700 may be integrated. For example, platform 702 and content services device(s) 730 may be integrated, or platform 702 and content delivery device(s) 740 may be integrated, or platform 702, content services device(s) 730, and content delivery device(s) 740 may be integrated, for example. In various embodiments, platform 702 and display 720 may be an integrated unit. Display 720 and content service device(s) 730 may be integrated, or display 720 and content delivery device(s) 740 may be integrated, for example. These examples are not meant to limit the invention.

In various embodiments, system 700 may be implemented as a wireless system, a wired system, or a combination of both. When implemented as a wireless system, system 700 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 700 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and so forth. Examples of wired communications media may include a wire, cable, metal leads, printed circuit board (PCB), backplane, switch fabric, semiconductor material, twisted-pair wire, co-axial cable, fiber optics, and so forth.

Platform 702 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The embodiments, however, are not limited to the elements or in the context shown or described in FIG. 4.

Figure 5:
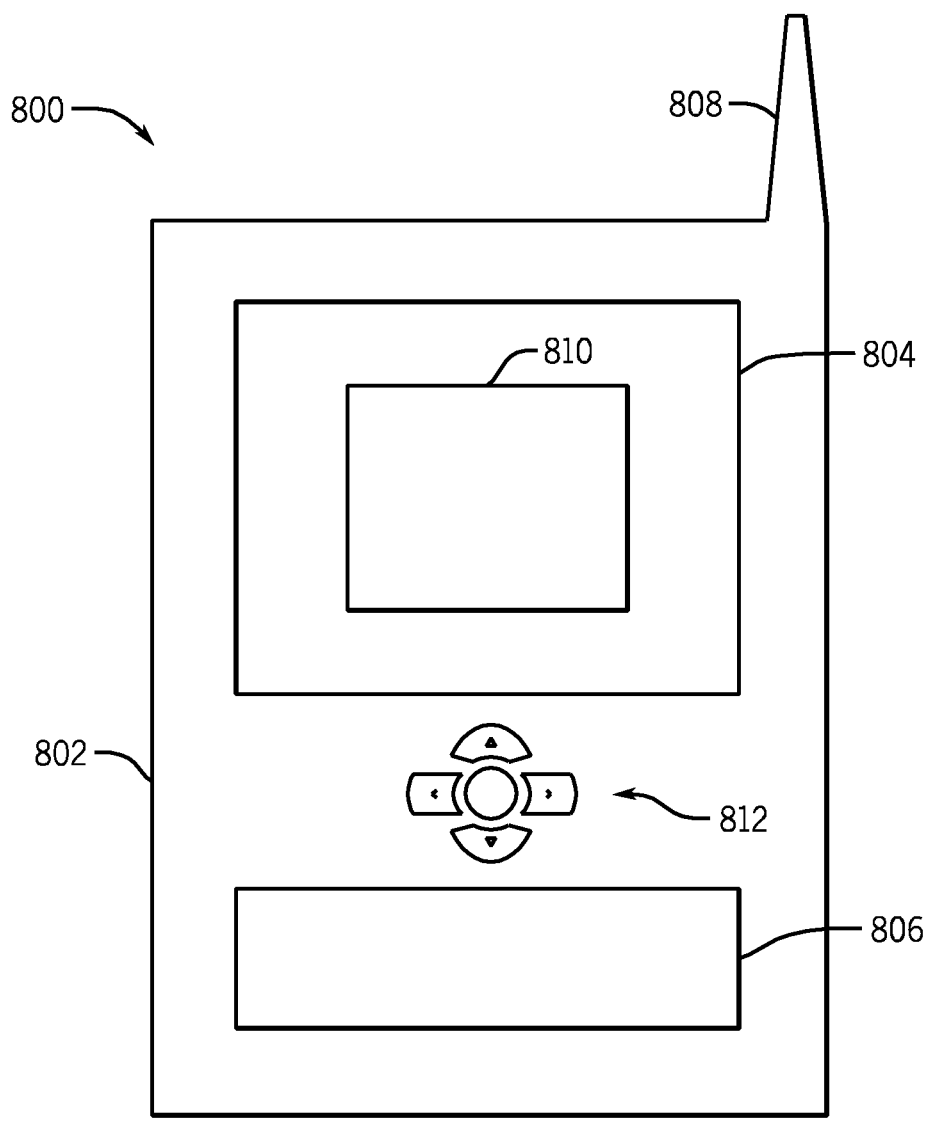
FIG. 5 is a front elevational view of one embodiment.

As described above, system 700 may be embodied in varying physical styles or form factors. FIG. 5 illustrates embodiments of a small form factor device 800 in which system 700 may be embodied. In embodiments, for example, device 800 may be implemented as a mobile computing device having wireless capabilities. A mobile computing device may refer to any device having a processing system and a mobile power source or supply, such as one or more batteries, for example.

As described above, examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Examples of a mobile computing device also may include computers that are arranged to be worn by a person, such as a wrist computer, finger computer, ring computer, eyeglass computer, belt-clip computer, arm-band computer, shoe computers, clothing computers, and other wearable computers. In embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

The processor 710 may communicate with a camera 722 and a global positioning system sensor 720, in some embodiments. A memory 712, coupled to the processor 710, may store computer readable instructions for implementing the sequences shown in FIGS. 2 and 3 in software and/or firmware embodiments.

As shown in FIG. 5, device 800 may comprise a housing 802, a display 804, an input/output (I/O) device 806, and an antenna 808. Device 800 also may comprise navigation features 812. Display 804 may comprise any suitable display unit for displaying information appropriate for a mobile computing device. I/O device 806 may comprise any suitable I/O device for entering information into a mobile computing device. Examples for I/O device 806 may include an alphanumeric keyboard, a numeric keypad, a touch pad, input keys, buttons, switches, rocker switches, microphones, speakers, voice recognition device and software, and so forth. Information also may be entered into device 800 by way of microphone. Such information may be digitized by a voice recognition device. The embodiments are not limited in this context.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

The graphics processing techniques described herein may be implemented in various hardware architectures. For example, graphics functionality may be integrated within a chipset. Alternatively, a discrete graphics processor may be used. As still another embodiment, the graphics functions may be implemented by a general purpose processor, including a multicore processor.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
dedicating a row or a column of a fuse array for storing a defective bit's address; and
determining whether a defective bit is in the row or column dedicated for storing the defective bit address.

2. The method of claim 1, including:
reading an address, stored in said array, of a defective bit in said array;
reading a state of the defective bit; and
inverting the state of the defective bit.

3. The method of claim 1 including determining whether a bit 0,0 is defective.

4. The method of claim 1 including determining whether a defective bit is the first defective bit to be identified.

5. The method of claim 4 including based on the number of previously detected defective bits, determining where to store the addresses of a defective bit.

6. One or more computer readable media storing instructions implemented by a processor to perform a sequence comprising:
dedicating a row or a column of a fuse said array for storing a defective bit's address; and
determining whether a defective bit is the first defective bit to be identified.

7. The media of claim 6, said sequence including:
reading an address, stored in said array, of a defective bit in said array;
reading a state of the defective bit; and
inverting the state of the defective bit.

8. The media of claim 6, said sequence including determining whether a defective bit is in a row or column dedicated for storing a defective bit address.

9. The media of claim 6, said sequence including determining whether a bit 0,0 is defective.

10. The media of claim 6, said sequence including based on the number of previously detected defective bits, determining where to store the addresses of a defective bit.

11. An apparatus comprising:
a fuse array; and
a controller to dedicate a row or a column of said array for storing a defective bit's address, said controller to determine whether a bit 0,0 is defective.

12. The apparatus of claim 11 including:
said controller to read an address, stored in said array, of a defective bit in said array, read a state of the defective bit, and invert the state of the defective bit.

13. The apparatus of claim 12 including an operating system.

14. The apparatus of claim 12 including a battery.

15. The apparatus of claim 12 including firmware and a module to update said firmware.

16. The apparatus of claim 11, said controller to determine whether a defective bit is in a row or column dedicated for storing a defective bit address.

17. The apparatus of claim 11, said controller to determine whether a defective bit is the first defective bit to be identified.

18. The apparatus of claim 17 based on the number of previously detected defective bits, determine where to store the addresses of a defective bit.

19. A storage comprising:
- a plurality of fuses, less than all of said fuses to store an address of a defective fuse; and
- a controller to read the address and invert a value stored at said address, said controller to determine whether a defective bit is in a row or column dedicated for storing a defective bit address.

20. The storage of claim 19, said controller to dedicate a row or a column of fuses for storing a defective bit's address.

21. The storage of claim 20, said controller to determine whether a bit 0,0 is defective.

\* \* \* \* \*

UNITED STATES PATENT AND TRADEMARK OFFICE
CERTIFICATE OF CORRECTION

| | |
|---|---|
| PATENT NO. | : 8,971,137 B2 |
| APPLICATION NO. | : 13/788020 |
| DATED | : March 3, 2015 |
| INVENTOR(S) | : Jason G. Sandri et al. |

It is certified that error appears in the above-identified patent and that said Letters Patent is hereby corrected as shown below:

In the Claims

Column 8, Line 29: "said" should be deleted.

Signed and Sealed this
Twenty-third Day of June, 2015

Michelle K. Lee
*Director of the United States Patent and Trademark Office*